(12) United States Patent
Dielacher et al.

(10) Patent No.: US 11,159,755 B2
(45) Date of Patent: Oct. 26, 2021

(54) TIME-OF-FLIGHT SENSOR WITH REDUCED TRANSISTOR COUNT PIXELS

(71) Applicant: Infineon Technologies AG, Neubiberg (DE)

(72) Inventors: Markus Dielacher, Graz (AT); Martin Flatscher, Graz (AT)

(73) Assignee: Infineon Technologies AG, Neubiberg (DE)

( * ) Notice: Subject to any disclaimer, the term of this patent is extended or adjusted under 35 U.S.C. 154(b) by 399 days.

(21) Appl. No.: 16/362,314

(22) Filed: Mar. 22, 2019

(65) Prior Publication Data

US 2020/0304741 A1    Sep. 24, 2020

(51) Int. Cl.
*H04N 5/369*    (2011.01)
*H04N 5/374*    (2011.01)
*H04N 5/378*    (2011.01)

(52) U.S. Cl.
CPC ......... *H04N 5/36965* (2018.08); *H04N 5/374* (2013.01); *H04N 5/378* (2013.01)

(58) Field of Classification Search
CPC .... H04N 5/36965; H04N 5/374; H04N 5/378; H01L 27/146; G01S 7/4914; G01S 7/4863; G01S 7/4866; G01S 17/08
See application file for complete search history.

(56) References Cited

U.S. PATENT DOCUMENTS

| | | | |
|---|---|---|---|
| 8,203,699 B2* | 6/2012 | Bamji | G01S 17/36 356/5.01 |
| 10,126,411 B2* | 11/2018 | Gilliland | G01S 17/894 |
| 2017/0034464 A1 | 2/2017 | Dielacher et al. | |
| 2018/0247968 A1 | 8/2018 | Na et al. | |

* cited by examiner

*Primary Examiner* — Seung C Sohn
(74) *Attorney, Agent, or Firm* — Murphy, Bilak & Homiller, PLLC

(57) ABSTRACT

A time-of-flight (TOF) sensor includes an array of pixels. Each pixel includes: a differential pixel configured to output a differential voltage signal between first and second nodes, based on an electrical modulation signal applied to different regions of the differential pixel and an incoming correlated light signal; a first readout circuit coupled to the first node; a second readout circuit coupled to the second node; and a compensation circuit coupled to the first and second readout circuits and configured to compensate for offset caused by incoming uncorrelated light. Each readout circuit has a storage device configured to be discharged by photo current during an exposure phase, sensed during a readout phase and recharged during a reset phase. Recharging of each storage device is controlled by a single reset transistor included in each compensation circuit or by one or more global reset transistors located outside the array of pixels.

19 Claims, 8 Drawing Sheets

TIME-OF-FLIGHT SENSOR WITH REDUCED TRANSISTOR COUNT PIXELS

BACKGROUND

Time-of-flight (TOF) sensors using active illumination can be saturated by sunlight or other uncorrelated light sources. Many types of TOF sensors utilize an array of differential pixels. Each differential pixel has an optical area which coverts incoming photons into charge carriers. Each differential pixel measures the phase difference between an electrical reference signal and an incoming optical signal, and also includes a pair of 4-transistor readout circuits for outputting the differential (sensing) signal. The electrical reference signal and outgoing optical signal from the TOF sensor are typically generated from the same source. A different source can be used, but with the same frequency. In either case, the phase offset is known and hence the signals may be considered correlated. The correlated signals cause a certain differential output voltage between two nodes of the same differential pixel which depends on TOF. The pair of 4-transistor readout circuits of the pixel captures the differential output voltage.

Background light which is not correlated with the electrical reference signal or the outgoing optical signal from the TOF sensor does not cause a change in the differential output voltage, but does add an offset. A regulation loop or similar type of compensation circuit may be added to each differential pixel for compensating the offset caused by incoming uncorrelated light. However, adding such a compensation circuit to a differential pixel reduces the size of the optical area for converting incoming photons into charge carriers. Otherwise, the pixel size must be increased.

Thus, there is a need for reducing the number of transistors in each differential pixel of a TOF sensor so that as much optical area as possible is available in each pixel for converting photons into charge carriers.

SUMMARY

According to a first embodiment of a time-of-flight (TOF) sensor, the TOF sensor comprises an array of pixels. Each pixel of the array of pixels comprises: a differential pixel configured to output a differential voltage signal between a first node and a second node, based on an electrical modulation signal applied to different regions of the differential pixel and an incoming correlated light signal; a first readout circuit coupled to the first node; a second readout circuit coupled to the second node; and a compensation circuit coupled to the first and the second readout circuits and configured to compensate for offset caused by incoming uncorrelated light. Each readout circuit of each pixel has a storage device configured to be discharged by photo current during an exposure phase, sensed during a readout phase and recharged during a reset phase. Recharging of the storage device of each readout circuit of each pixel is controlled by a single reset transistor included in each compensation circuit or by one or more global reset transistors located outside the array of pixels.

Further according to the first embodiment, the compensation circuit of each pixel may comprise a first compensation current source coupled to the first readout circuit of the pixel and a second compensation current source coupled to the second readout circuit of the pixel, and recharging of the storage device of each readout circuit of each pixel may be controlled by a single reset transistor included in each compensation circuit and configured to turn on the first and the second compensation current sources during the reset phase.

Further according to the first embodiment, the compensation circuit of each pixel may comprise a first pMOS transistor coupled to the first readout circuit of the pixel and a second pMOS transistor coupled to the second readout circuit of the pixel, and recharging of the storage device of each readout circuit of each pixel may be controlled by a single reset transistor included in each compensation circuit and connected between a gate of the first and the second pMOS transistors of the compensation circuit and ground and having a gate coupled to a control signal that is active during the reset phase.

Further according to the first embodiment, the compensation circuit of each pixel may comprise a first compensation current source coupled to the first readout circuit of the pixel and a second compensation current source coupled to the second readout circuit of the pixel, and recharging of the storage device of each readout circuit of each pixel may be controlled by one or more global reset transistors located outside the array of pixels and configured to turn on the first and the second compensation current sources of each compensation circuit during the reset phase.

Further according to the first embodiment, the compensation circuit of each pixel may comprise a first pMOS transistor coupled to the first readout circuit of the pixel, a second pMOS transistor coupled to the second readout circuit of the pixel, a pull-down circuit configured to pull down a gate of the first and the second pMOS transistors to ground responsive to the voltage at the first node or the second node of the differential pixel reaching a threshold, and a pull-up circuit having a first node coupled to the gate of the first and the second pMOS transistors and a second node coupled to either a voltage supply or ground through the one or more global reset transistors. The one or more global reset transistors may be configured to couple a gate of each pull-up circuit to a bias voltage and the second node of each pull-up circuit to the voltage supply during the exposure phase, and to couple the gate of each pull-up circuit to ground and the second node of each pull-up circuit to ground during the reset phase.

Further according to the first embodiment, each readout circuit of each pixel may be a 3-transistor readout circuit, or each readout circuit of each pixel may consist of two transistors and a transfer gate.

According to a second embodiment of a TOF sensor, the TOF sensor comprises an array of pixels. Each pixel of the array of pixels comprises: a differential pixel configured to output a differential voltage signal between a first node and a second node, based on an electrical modulation signal applied to different regions of the differential pixel and an incoming correlated light signal; a first readout circuit coupled to the first node; a second readout circuit coupled to the second node; and a compensation circuit coupled to the first and the second readout circuits and configured to compensate for offset caused by incoming uncorrelated light. Each readout circuit of each pixel has a storage device configured to be discharged by photo current during an exposure phase, sensed during a readout phase and recharged during a reset phase. Recharging of the storage device of each readout circuit of each pixel is controlled by a single reset transistor included in each compensation circuit.

Further according to the second embodiment, the compensation circuit of each pixel may comprise a first compensation current source coupled to the first readout circuit of the pixel and a second compensation current source coupled to the second readout circuit of the pixel, and the single reset transistor included in the compensation circuit of each pixel may be configured to turn on the first and the second compensation current sources of the compensation circuit during the reset phase.

Further according to the second embodiment, the first compensation current source of each pixel may comprise a first pMOS transistor coupled to the first readout circuit of the pixel, the second compensation current source of each pixel may comprise a second pMOS transistor coupled to the second readout circuit of the pixel, and the single reset transistor included in the compensation circuit of each pixel may be connected between ground and a gate of the first and the second pMOS transistors of the compensation circuit and have a gate coupled to a control signal that is active during the reset phase.

Further according to the second embodiment, the first readout circuit of each differential pixel may comprise a first hold transistor, a first read transistor, a first select transistor and no reset transistor, the second readout circuit of each differential pixel may comprise a second hold transistor, a second read transistor, a second select transistor and no reset transistor, the compensation circuit of each pixel may comprise a first pMOS transistor coupled to the first readout circuit of the pixel, a second pMOS transistor coupled to the second readout circuit of the pixel, a single pull-up pMOS transistor coupled to a gate of the first and the second pMOS transistors, a pair of pull-down pMOS transistors coupled to the gate of the first and the second pMOS transistors and the single reset transistor which is connected between ground and the gate of the first and the second pMOS transistors.

Further according to the second embodiment, each readout circuit of each pixel may be a 3-transistor readout circuit, or each readout circuit of each pixel may consist of two transistors and a transfer gate.

According to a third embodiment of a TOF sensor, the TOF sensor comprises an array of pixels. Each pixel of the array of pixels comprises: a differential pixel configured to output a differential voltage signal between a first node and a second node, based on an electrical modulation signal applied to different regions of the differential pixel and an incoming correlated light signal; a first readout circuit coupled to the first node; a second readout circuit coupled to the second node; and a compensation circuit coupled to the first and the second readout circuits and configured to compensate for offset caused by incoming uncorrelated light. Each readout circuit of each pixel has a storage device configured to be discharged by photo current during an exposure phase, sensed during a readout phase and recharged during a reset phase. Recharging of the storage device of each readout circuit of each pixel is controlled by one or more global reset transistors located outside the array of pixels.

Further according to the third embodiment, the compensation circuit of each pixel may comprise a first compensation current source coupled to the first readout circuit of the pixel and a second compensation current source coupled to the second readout circuit of the pixel, and the one or more global reset transistors may be configured to turn on the first and the second compensation current sources of each compensation circuit during the reset phase.

Further according to the third embodiment, the compensation circuit of each pixel may comprise a first pMOS transistor coupled to the first readout circuit of the pixel, a second pMOS transistor coupled to the second readout circuit of the pixel, a pull-down circuit configured to pull down a gate of the first and the second pMOS transistors to ground responsive to the voltage at the first node or the second node of the differential pixel reaching a threshold, and a pull-up circuit having a first node coupled to the gate of the first and the second pMOS transistors and a second node coupled to either a voltage supply or ground through the one or more global reset transistors, and the one or more global reset transistors may be configured to couple a gate of each pull-up circuit to a bias voltage and the second node of each pull-up circuit to the voltage supply during the exposure phase, and couple the gate of each pull-up circuit to ground and the second node of each pull-up circuit to ground during the reset phase.

Further according to the third embodiment, the first readout circuit of each differential pixel may comprise a first hold transistor, a first read transistor, a first select transistor and no reset transistor, the second readout circuit of each differential pixel may comprise a second hold transistor, a second read transistor, a second select transistor and no reset transistor, and the compensation circuit of each pixel may comprise a first pMOS transistor coupled to the first readout circuit of the pixel, a second pMOS transistor coupled to the second readout circuit of the pixel, a single pull-up pMOS transistor coupled to a gate of the first and the second pMOS transistors, a pair of pull-down pMOS transistors coupled to the gate of the first and the second pMOS transistors, and the one or more global reset transistors may be connected between ground and the gate of the first and the second pMOS transistors of each compensation circuit.

Further according to the third embodiment, each readout circuit of each pixel may be a 3-transistor readout circuit, or each readout circuit of each pixel consists of two transistors and a transfer gate.

Those skilled in the art will recognize additional features and advantages upon reading the following detailed description, and upon viewing the accompanying drawings.

BRIEF DESCRIPTION OF THE FIGURES

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

The embodiments described herein provide a time-of-flight (TOF) sensor having an array of pixels. Each pixel of the array includes a differential pixel, a pair of readout circuits coupled to the differential pixel, and an offset compensation circuit. Recharging of the storage device of each readout circuit of each pixel is controlled by a single reset transistor included in each compensation circuit of each pixel, or by one or more global reset transistors located outside the pixel array. Hence, the number of transistors in each differential pixel is reduced so that as much optical area as possible is available in each pixel for converting photons into charge carriers.

Figure 1:
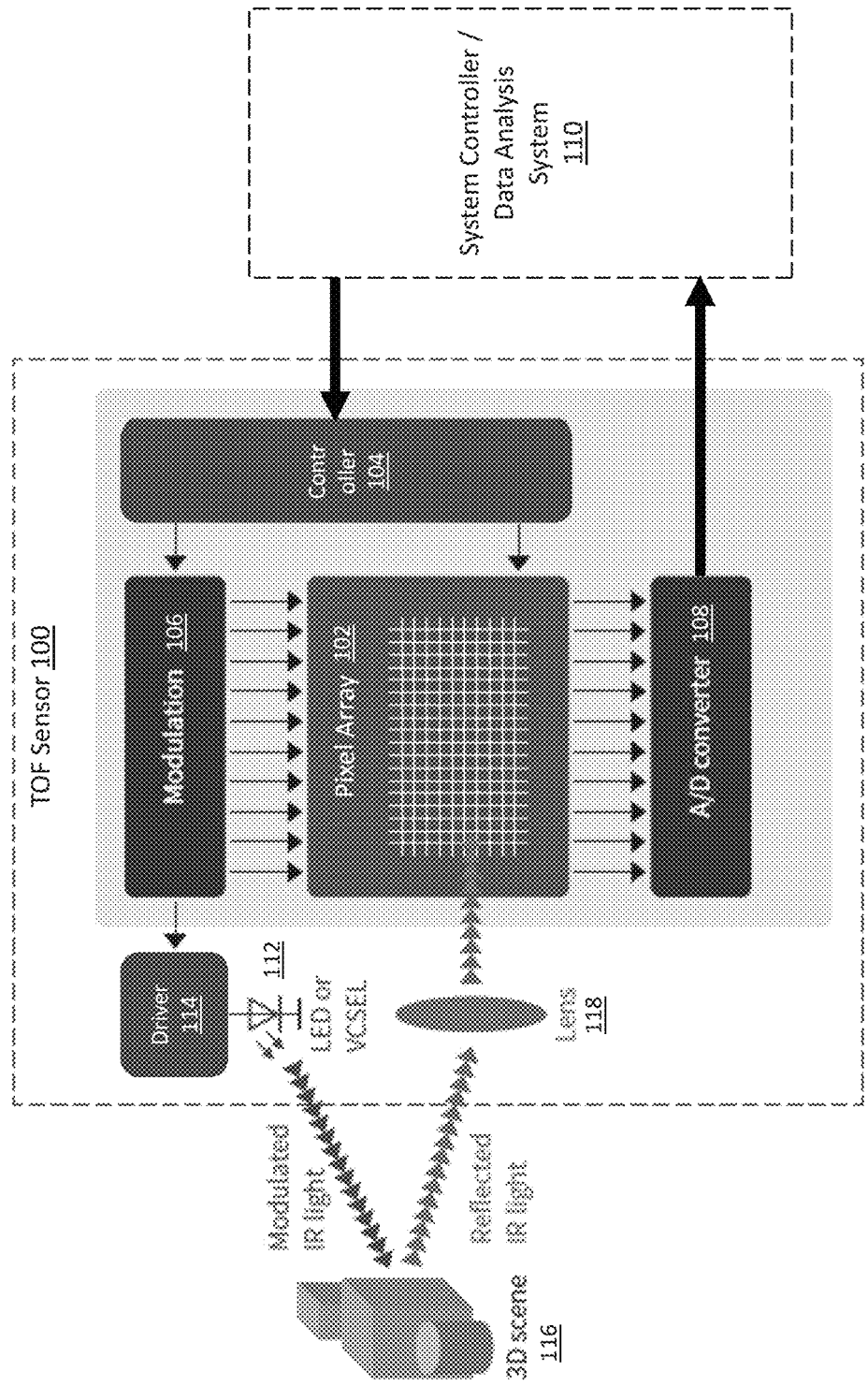
FIG. 1 illustrates a block diagram of an embodiment of a time-of-flight (TOF) sensor.

FIG. 1 illustrates an embodiment of a TOF sensor 100. The TOF sensor 100 includes an array of pixels 102, a controller 106 and logic 106 for illumination control, modulation of the pixel array 102 and generation of autonomous imaging phase sequences, and an A/D (analog-to-digital) converter 108 for providing a full digital readout of the pixel array data to a system controller/data analysis system 110. The system controller/data analysis system 110 may control frame rate, exposure time, modulation frequency, etc. of the TOF sensor 100 over a communication interface such as I²C, for example.

The TOF sensor 100 measures depth and amplitude information in every pixel of the pixel array 102 by using a light source 112 such as an LED (light emitting diode), VCSEL (vertical cavity surface emitting laser), etc. and a corresponding driver 114. The TOF sensor 100 emits modulated light and captures light reflected from scenery 116, which is correlated to the modulated light. A lens system 118 focusses the received light, which includes the reflected (correlated) light and background (uncorrelated) light, onto the pixel array 102. The pixel array 102 measures the phase difference between emitted and received light and corresponding amplitude values, from which highly reliable distance information and a greyscale picture of the complete scene may be produced.

Figure 2:
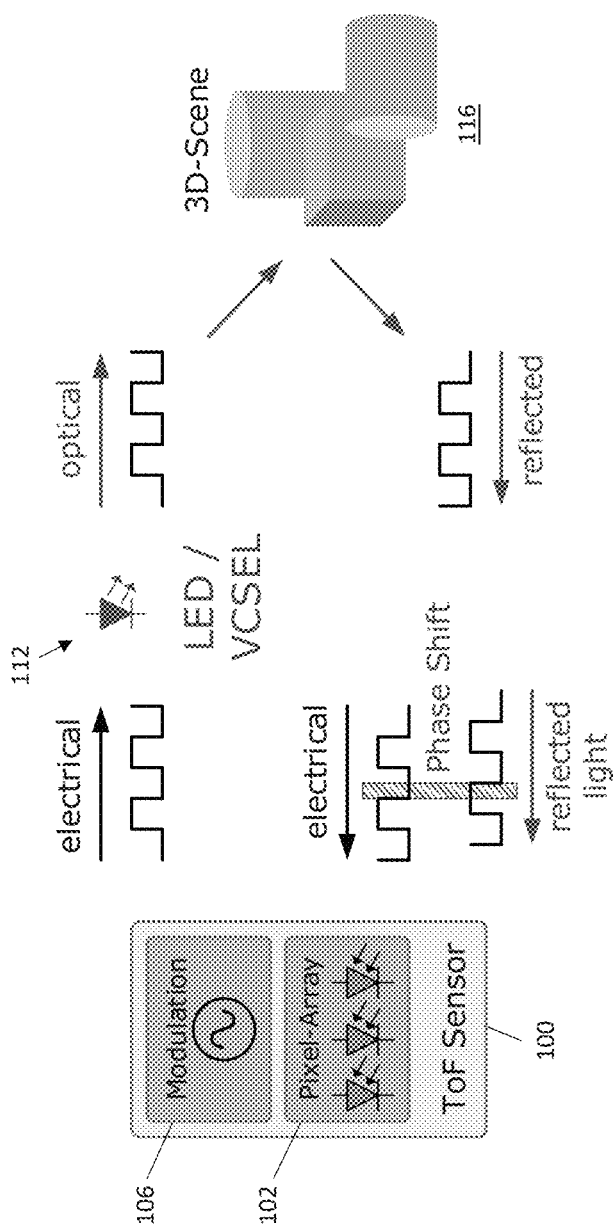
FIG. 2 illustrates the general operation of the TOF sensor.

FIG. 2 illustrates the general operation of the TOF sensor 100. Not all components of the TOF sensor 100 are shown in FIG. 2 to reduce confusion. A modulated optical signal ('optical') is generated based on an electrical reference signal ('electrical'). The modulated optical signal is emitted by the light source 112 of the TOF sensor 100 toward scenery 116. Light reflected off the scenery 116 (reflected), which is correlated with the modulated optical signal and hence the electrical reference signal, is received at the TOF sensor 100. The reflected light is converted to an electrical signal by the pixel array 102. A phase shift ('Phase Shift') is present between the electrical signal generated by the pixel array 102 and the original (modulated) electrical reference signal. The phase shift corresponds to the distance between the TOF sensor 100 and the scenery 116 off which the outgoing modulated optical signal is reflected. The identical modulation signal used to generate the electrical reference signal or a related signal is applied to the pixel array 102 to capture an accurate representation of the phase difference.

Figure 3:
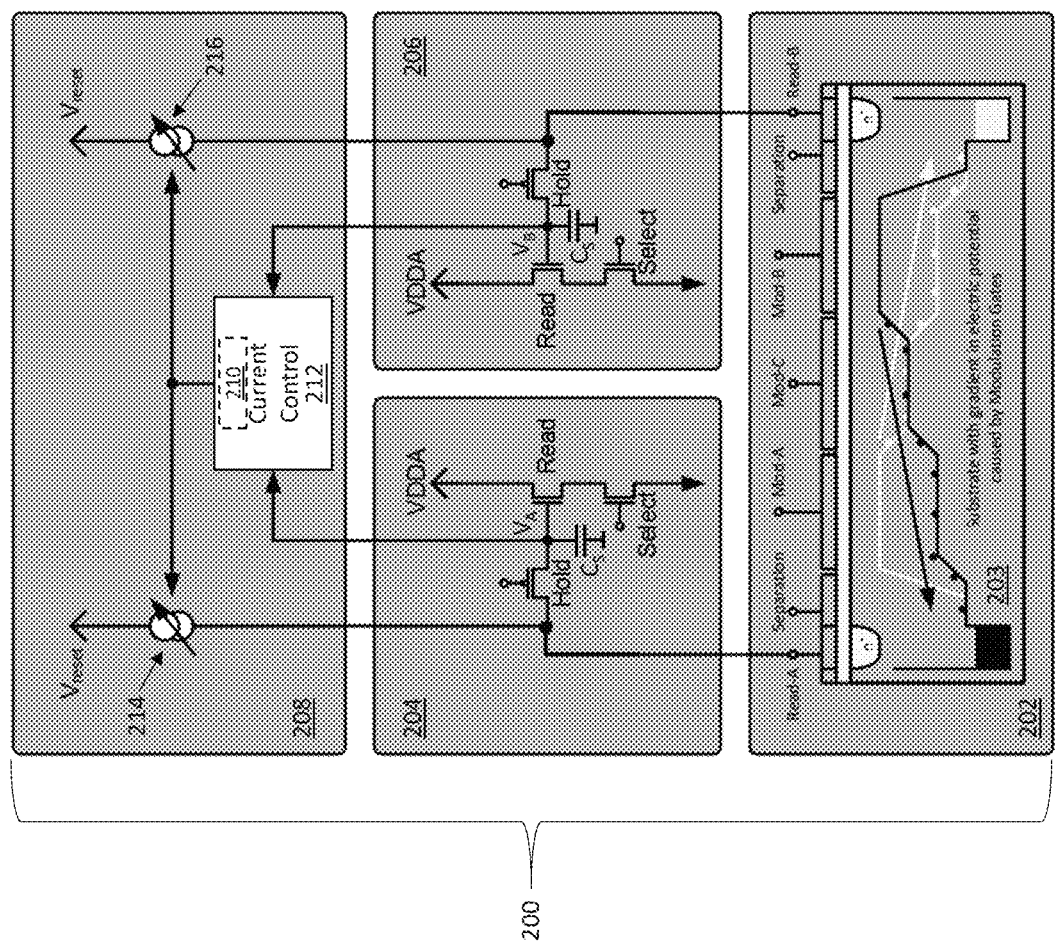
FIG. 3 illustrates a schematic diagram of an embodiment of each pixel included in the pixel array of the TOF sensor.

FIG. 3 illustrates an embodiment of each pixel 200 included in the pixel array 102 of the TOF sensor 100. According to this embodiment, the pixel 200 includes a differential pixel 202 configured to output a differential voltage signal between a first node ('Read-A') and a second node ('Read-B') of the differential pixel 202. The differential pixel 202 outputs the differential voltage signal based on the electrical modulation signal used to generate the corresponding outgoing modulated optical signal, or based on a signal related to the electrical modulation signal.

In one embodiment, the differential pixel 202 is a photon mixing device (PMD) as shown in FIG. 3. The PMD includes a p-type substrate 203 and n+ regions ('n+') formed on opposite sides of the PMD to form diodes on both sides of the PMD. The doping may be reversed (e.g., n-type substrate and p+ regions formed on opposite sides of the device). The PMD also includes different modulation regions and a control gate split into different regions (Mod-A, Mod-B, Mod-C) for biasing the modulation regions. Due to biasing applied at the different regions of the control gate, the PMD does not function as a conventional transistor. For example, by applying the identical or corresponding (differential) electrical modulation signal used to generate the outgoing modulated optical signal between gate regions Mod-A and Mod-B of the control gate, an electric field is generated with the substrate 203 of the PMD. Depending on whether gate region Mod-A or Mod-B is high, the electric field has a certain gradient within the substrate 203. Due to the electric field gradient within the substrate 203, charge carriers generated by correlated incoming light are shifted to one side or the other side of the differential pixel 202 where the charge carriers are accumulated. The accumulation regions are illustrated as buckets in FIG. 3, whereas electric field gradients and charge carrier movement is indicated by the solid lines and filled circles, respectively. An optional center gate region Mod-C of the PMD is kept at a static voltage.

Figure 4:
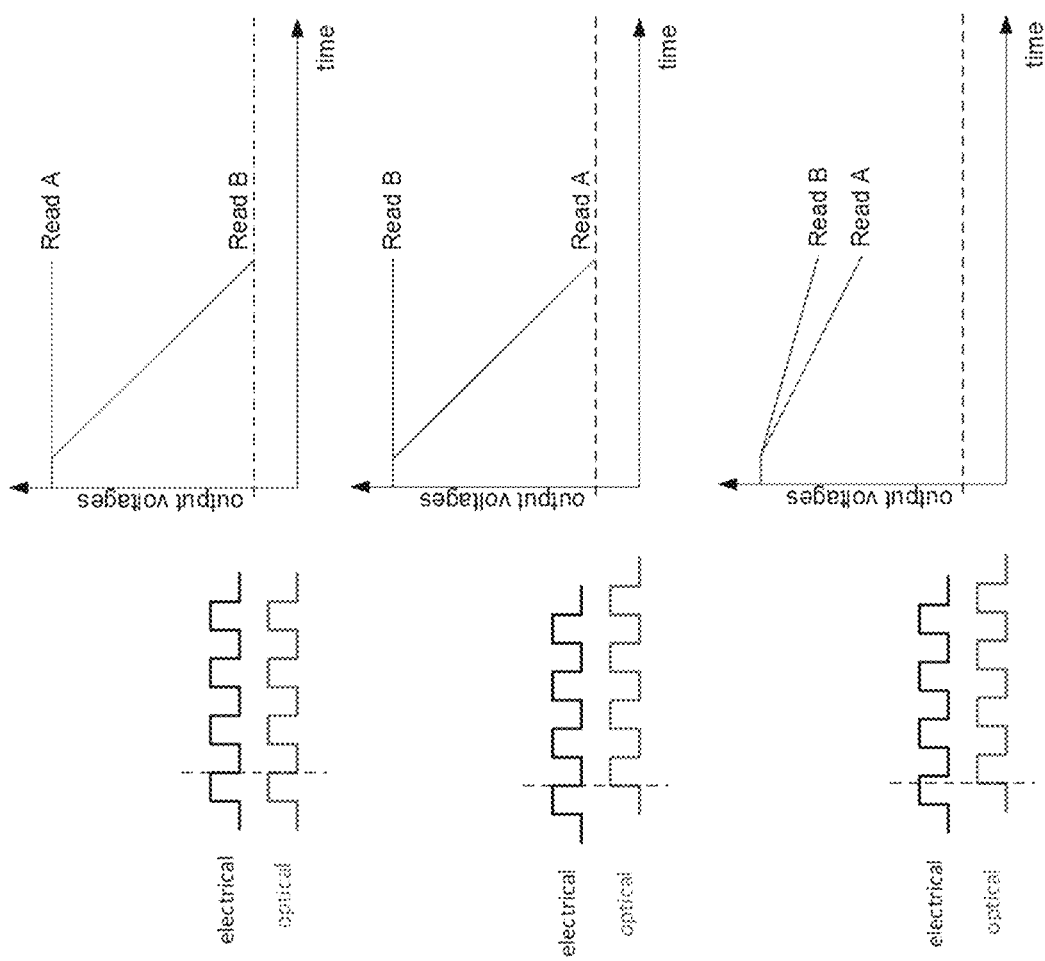
FIG. 4 illustrates operation of each differential pixel included in the pixel array of the TOF sensor under different incoming light conditions.

In a mathematical sense, each differential pixel 202 performs multiplication plus a subsequent integration. This is illustrated in FIG. 4, which shows three different scenarios. In the upper scenario, the electrical reference signal and the incoming correlated optical signal are perfectly in phase. As a result, substantially all charge carriers generated in the substrate 203 of the differential pixel 202 move to the second node Read-B. In the middle scenario, the electrical reference signal and the incoming correlated optical signal are completely out of phase. As a result, substantially all charge carriers generated in the substrate 203 of the differential pixel 202 move to the first node Read-A. In the lower scenario, a random phase difference is present between the electrical reference signal and the incoming correlated optical signal and the generated charge carrier is distributed accordingly in the substrate 203 of the differential pixel 202. In each case, the differential voltage signal output between node Read-A and node Read-B of the differential pixel 202 represents the phase difference information.

Other types of differential pixels may be used. For example, each differential pixel 202 of the pixel array 102 may be a current-assisted photonic demodulator (CAPD) pixel.

In each case, each different pixel 202 of the pixel array 102 also includes a first readout circuit 204 coupled to node Read-A of the differential pixel 202, a second readout circuit 206 coupled to node Read-B of the differential pixel 202, and a compensation circuit 208 coupled to the first and the second readout circuits 204, 206 and configured to compensate for offset caused by incoming uncorrelated light such as background light, sunlight, etc. The term "incoming uncorrelated light" as used herein means light hitting the pixel array 102 and which is not correlated with the electrical reference signal or the outgoing optical signal from the TOF sensor 100. Uncorrelated light does not cause a change in the differential voltage output by the differential pixel 202, but does add an offset.

Each readout circuit 204 2106 of each pixel 200 has a storage device $C_S$ configured to be discharged by photo current during an exposure phase, sensed during a readout phase and recharged during a reset phase of the pixel 200. The readout circuit storage devices $C_S$ are shown as capacitors in FIG. 3 and may be implemented as parasitic capacitance, e.g., made up mostly by the gate capacitance of the corresponding read transistor (Read') of each readout circuit 204, 206.

Figure 5:
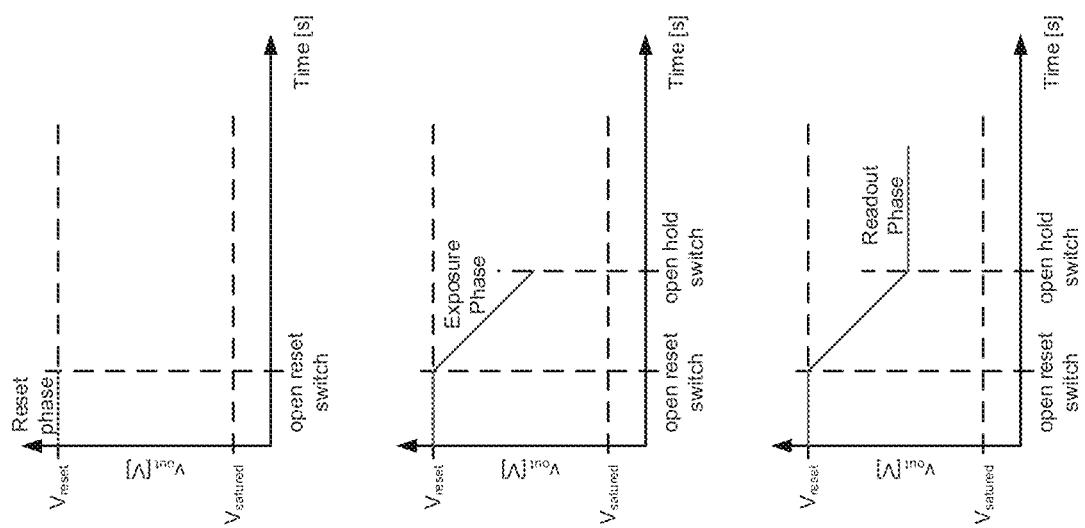
FIG. 5 illustrates reset, exposure and readout phases for each pixel of the pixel array of the TOF sensor.

FIG. 5 illustrates the reset phase, exposure phase, and readout phase for each pixel 200 of the pixel array 102. According to the pixel embodiment illustrated in FIG. 3, recharging of the storage device $C_S$ of each readout circuit 204, 206 of each pixel 200 during the reset phase is controlled by a single reset transistor 210 included in each compensation circuit 208 of each pixel 200. During the reset phase, which is illustrated in the upper part of FIG. 5, the storage device $C_S$ of each readout circuit 204, 206 is connected to a reset voltage $V_{reset}$ and the corresponding voltage $V_A$, $V_B$ of the storage device $C_S$ is charged to $V_{reset}$ through the single reset transistor 210 included in the compensation circuit 208 of each pixel 200.

During the exposure phase, which is illustrated in the middle part of FIG. 5, the storage device $C_S$ of each readout circuit 204, 206 is disconnected from $V_{reset}$ and discharged by photo current, depending on the amount of correlated light falling onto the corresponding diode. During the readout phase, which is illustrated in the lower part of FIG. 5, the storage device $C_S$ of each readout circuit 204, 206 is disconnected from the corresponding photo diode. Charge is stored by the storage device $C_S$ and the resulting voltage is fed to the A/D converter 108 via a select transistor ('Select') of the corresponding readout circuit 204, 206. A hold transistor ('Hold') of each readout circuit 204, 206 is opened during the readout phase so that no current flows into the corresponding storage device $C_S$, and the phase information is stored until the next reset phase.

The compensation circuit 208 of each pixel 200 may include a current control loop 212 and identical or nearly identical compensation current sources 214, 216 for compensating incoming uncorrelated light, as shown in FIG. 3. Incoming uncorrelated light may be introduced by unmodulated background light, sunlight, etc. and introduces an offset to the differential voltage output by the differential pixel 202. The control voltage for the current control loop 212 of the compensation circuit 208 is derived from the output node voltages $V_A$, $V_B$ of the readout circuits 204, 206 for that pixel 200.

Further according to the pixel embodiment illustrated in FIG. 3, each compensation circuit 208 also includes a single transistor 210 used to recharge the storage device $C_S$ of each readout circuit 204, 206 of the pixel 200. This way, neither readout circuit 204, 206 of the pixel 200 includes an additional reset transistor for recharging the storage devices $C_S$ of the readout circuits 204, 206. Instead, each readout circuit 204, 206 of the pixel 200 is a 3-transistor readout circuit according to the pixel embodiment illustrated in FIG. 3. That is, each readout circuit 204, 206 of the pixel 200 consists of three transistors: the hold transistor 'Hold', the read transistor 'Read' and the select transistor 'Select'.

The hold transistor 'Hold' of each readout circuit 204, 206 is turned off (opened) at the point labelled 'open hold switch' in the middle and lower parts of FIG. 5 which corresponds to the end of the exposure phase and the beginning of the readout phase. The select transistor 'Select' of the readout circuits 204, 206 of the same pixel 200 enable selection of the respective pixel storage devices $C_S$ for readout. The read transistors 'Read' of each readout circuit 204, 206, which are connected between the corresponding select transistor 'Select' and a voltage supply VDDA, turn on based on the state of the corresponding storage device $C_S$ coupled to its gate. The read transistors 'Read' are configured as source followers. The current through each read transistor 'Read' is defined by a current source not shown in the figures. All pixels 200 in a column of pixels 200 may share one current source, but only pixel 200 at a time is connected to the current source by closing the corresponding select transistor 'Select'. The other pixels 200 in that column have their respective select switches 'Select' opened and are not connected to the current source.

As explained above, the current through the read transistor 'Read' connected to a current source by the corresponding select transistor 'Select' is defined by the current source. The voltage at the gate of the read transistor 'Read' is defined by the corresponding storage device $C_S$. The drain of the read transistor 'Read' is also defined, since the drain is connected to voltage supply VDDA. The only variable, then, is the source of the read transistor 'Read'. Since the current through the read transistor 'Read' is proportional to its gate-source voltage, and the source voltage is the only variable, the source voltage will adjust so that the relation is satisfied. The source of the read transistor 'Read' thus follows the gate which is coupled to node $V_A$ of the pixel 200, and which is sensed by the A/D converter 108 when the corresponding select transistor 'Select' of the readout circuit 204, 206 is closed.

The single reset transistor 210 included in the compensation circuit 208 of each pixel 200 is configured to turn on the compensation current sources 214, 216 during the reset phase, to enable recharging of the storage devices $C_S$ of both readout circuits 204, 206 of the pixel 200. The single transistor 210 is turned off (opened) at the point labelled 'open reset switch' in the upper part of FIG. 5 which shows the reset phase of the pixel. The control signal applied to the gate of the reset transistor 210 included in the compensation circuit 208 of each pixel 200 may be a digital signal globally communicated to the entire pixel array 102. The storage devices $C_S$ of each pixel 200 are discharged as a function of the number of charge carriers which accumulate within the substrate 203 at the respective nodes Read-A, Read-B of the differential pixel 202 during the exposure phase, as explained in connection with FIG. 4.

Figure 6:
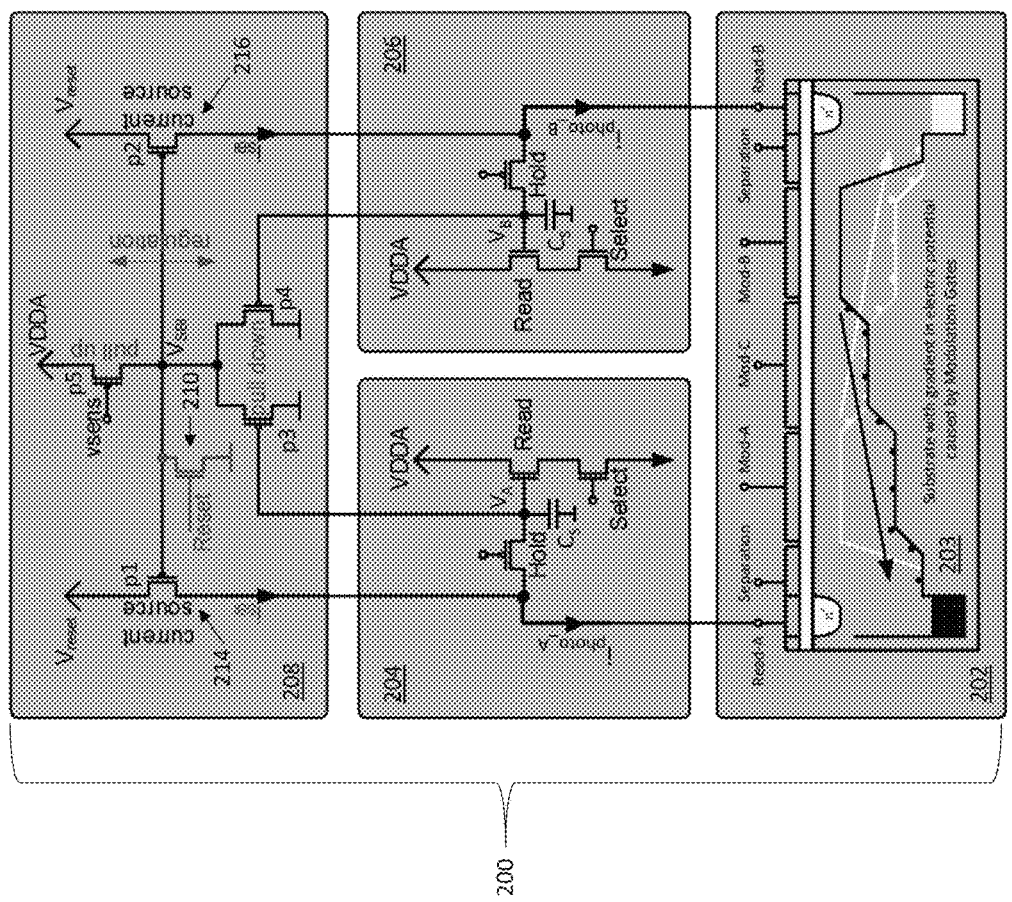
FIG. 6 illustrates a schematic diagram of an embodiment of a compensation circuit included in each pixel of the pixel array of the TOF sensor.

FIG. 6 illustrates an embodiment of the compensation circuit 208 with the single transistor 210 for recharging the storage device $C_S$ of both readout circuits 204, 206 of the pixel 200. According to this embodiment, each pixel 200 of the pixel array 102 contains 12 transistors: 3 transistors in each readout circuit 204, 206; and 6 transistors in the compensation circuit 208. The compensation current sources 214, 216 of the compensation circuit 208 may be implemented as pMOS transistors p1, p2. The first pMOS transistor p1 is coupled to the first readout circuit 204 of the pixel 200, and the second pMOS transistor p2 is coupled to the second readout circuit 206 of the pixel 200.

The current control loop 212 of the compensation circuit 208 includes a pull-down circuit formed by two pMOS transistors p3, p4 configured to pull down node $V_{SBI}$, which is coupled to the gate of pMOS compensation current source transistors p1, p2, to ground responsive to the voltage at node $V_A$ or node $V_B$ of the differential pixel 202 reaching a threshold. The current control loop 212 of the compensation circuit 208 also includes a pull-up circuit formed by a pMOS transistor p5 having a first node coupled to the gate of pMOS compensation current source transistors p1, p2 at node $V_{SBI}$ and a second node coupled to voltage supply VDDA. The pull-down and pull-up circuits of the compensation circuit 208 provide a regulation loop.

Before the regulation loop of the compensation circuit 208 is activated, both readout voltages $V_A$ and $V_B$ of the pixel 200 have not reached a value where the current control loop 212 of the compensation circuit 208 is activated. The pMOS transistor p5 of the pull-up circuit pulls the gates of the pMOS compensation current source transistors p1, p2 to VDDA to deactivate both current sources 214, 216. When one of the readout node voltages $V_A$ or $V_B$ reaches the threshold to activate the current control loop 212, the corresponding pMOS transistor p3, p4 of the pull-down circuit turns on and activates a current path from VDDA through the pMOS transistor p5 of the pull-up circuit. Together, these two pMOS transistors (p3 or p4 and p5) form a resistive divider since each pMOS transistor has an Ron (on-state resistance), and the ratio between the two Ron values defines the gate voltage of the pMOS compensation current source transistors p1, p2. The voltage at the gate of the pMOS transistor p5 of the pull-up circuit is not at ground or VDDA, but has a defined potential to control its Ron.

Figure 7:
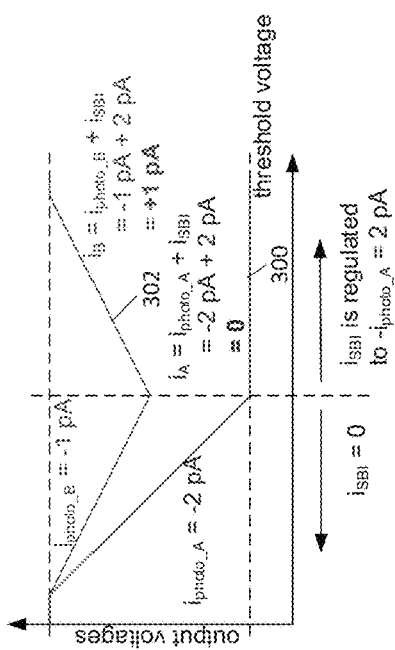
FIG. 7 illustrates operation of a current control loop of the compensation circuit shown in FIG. 6.

FIG. 7 illustrates operation of the current control loop 212 of the compensation circuit 208. As explained above, the compensation circuit 208 senses the readout nodes $V_A$, $V_B$ of the readout circuits 204, 206. When one of the two nodes $V_A$, $V_B$ is discharged to a certain threshold, the pMOS compensation current source transistors p1, p2 of the compensation circuit 208 are activated. The readout node discharged faster activates the regulation loop, and causes the pMOS compensation current source transistors p1, p2 to sink a compensation current ism which is exactly or nearly equivalent to the photocurrent which is discharging the node. For example, in FIG. 7, photo current $i_{photo\_A}$ goes from storage node CA into the substrate 203 of the differential pixel 202 at node Read-A and photo current $i_{photo\_B}$ goes from storage node CB into the substrate 203 of the differential pixel 202 at node Read-B. Photo currents $i_{photo\_A}$ and $i_{photo\_B}$ are sensed by the compensation circuit 208 and compensated with a compensation current $i_{SBI}$, e.g., +2 pA. If $i_{photo\_A}$ is -2 pA, ism fully compensates $i_{photo\_A}$ and the output voltage $V_A$ no longer changes and is frozen as indicated by the line labelled 300 in FIG. 7. On the other side of the differential pixel 202, photo current $i_{photo\_B}$ is lower than photo current $i_{photo\_A}$ and therefore overcompensated by $i_{SBI}$ in that $i_{photo\_B}$ continues to change and is not frozen during regulation by the compensation circuit 208 as indicated by the line labelled 302 in FIG. 7. The compensation circuit 208 compensates both sides of the differential pixel 202 with the same amount of current $i_{SBI}$.

In addition to the current regulation function explained above, the compensation circuit 208 of the pixel 200 also enables recharging of each storage device $C_S$ of the readout circuits 204, 206 of the pixel 200. According to the embodiment illustrated in FIG. 6, the compensation circuit 208 also includes a single reset transistor 210 such as an nMOS transistor for controlling recharging of the storage devices $C_S$ of the readout circuits 204, 206 of the pixel 200. During the reset phase shown in the upper part of FIG. 5, the single reset transistor 210 is closed to pull down the gates of the pMOS transistors p1, p2 which form the compensation current sources 214, 216 of the compensation circuit 208. The hold transistor 'Hold' of both readout circuits 204, 206 are closed during the reset phase, so that the respective storage devices $C_S$ of the readout circuits 204, 206 are coupled to the reset voltage $V_{reset}$ and the storage devices $C_S$ are recharged to $V_{reset}$ through the single reset transistor 210 included in the compensation circuit 208 of the pixel 200.

Figure 8:
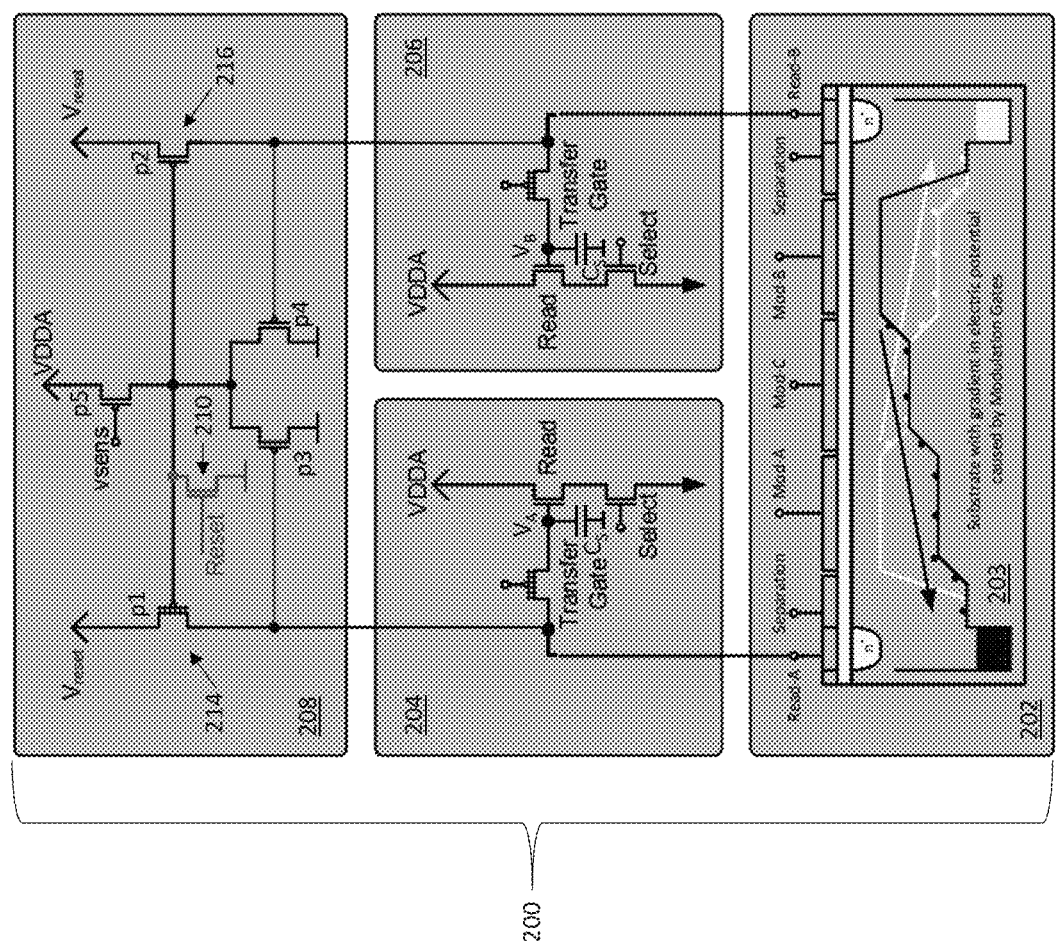
FIG. 8 illustrates a schematic diagram of another embodiment of each pixel included in the pixel array of the TOF sensor.

FIG. 8 illustrates another embodiment of each pixel 200 included in the pixel array 102 of the TOF sensor 100. The embodiment shown in FIG. 8 is similar to the embodiment shown in FIGS. 3 and 6. Different, however, each readout circuit 204, 206 of the pixel 200 consists of two transistors ('Read' and 'Select') and a transfer (pass) gate ('Transfer Gate') instead of three transistors. Particularly, the hold transistor 'Hold' of each readout circuit 204, 206 in FIGS. 3 and 6 is replaced with a transfer gate 'Transfer Gate' in FIG. 8. Each transfer gate 'Transfer Gate' is configured to transfer charge to or from the corresponding storage device $C_S$ of the respective readout circuits 204, 206. The gates of the pMOS transistors p3, p4 of the pull-down circuit of the compensation circuit 208 are also coupled to the corresponding output of the respective compensation current sources 214, 216 of the compensation circuit 208 instead of to the corresponding output voltage node $V_A$, $V_B$ of the readout circuits 204, 206.

An advantage of using transfer gates is that the charge transfer does not introduce noise. When using a transistor with a capacitor, the transistor switching adds a certain amount of noise to the voltage stored in the corresponding storage device $C_S$ during the hold phase. The noise is inversely proportional to the size of the storage device $C_S$ ($kT/C_S$). Conversely, when a transfer gate is used instead, essentially all accumulated charged can be transferred to corresponding storage device $C_S$ with no noise or variation. This is particularly beneficial when a technique commonly referred to as "correlated double sampling" is applied to remove reset noise. In this case, the gates of pMOS transistors p3, p4 of the pull-down circuit of the compensation circuit 208 are connected differently because the readout nodes are disconnected from the diodes during exposure, and continuous regulation is not possible.

Figure 9:
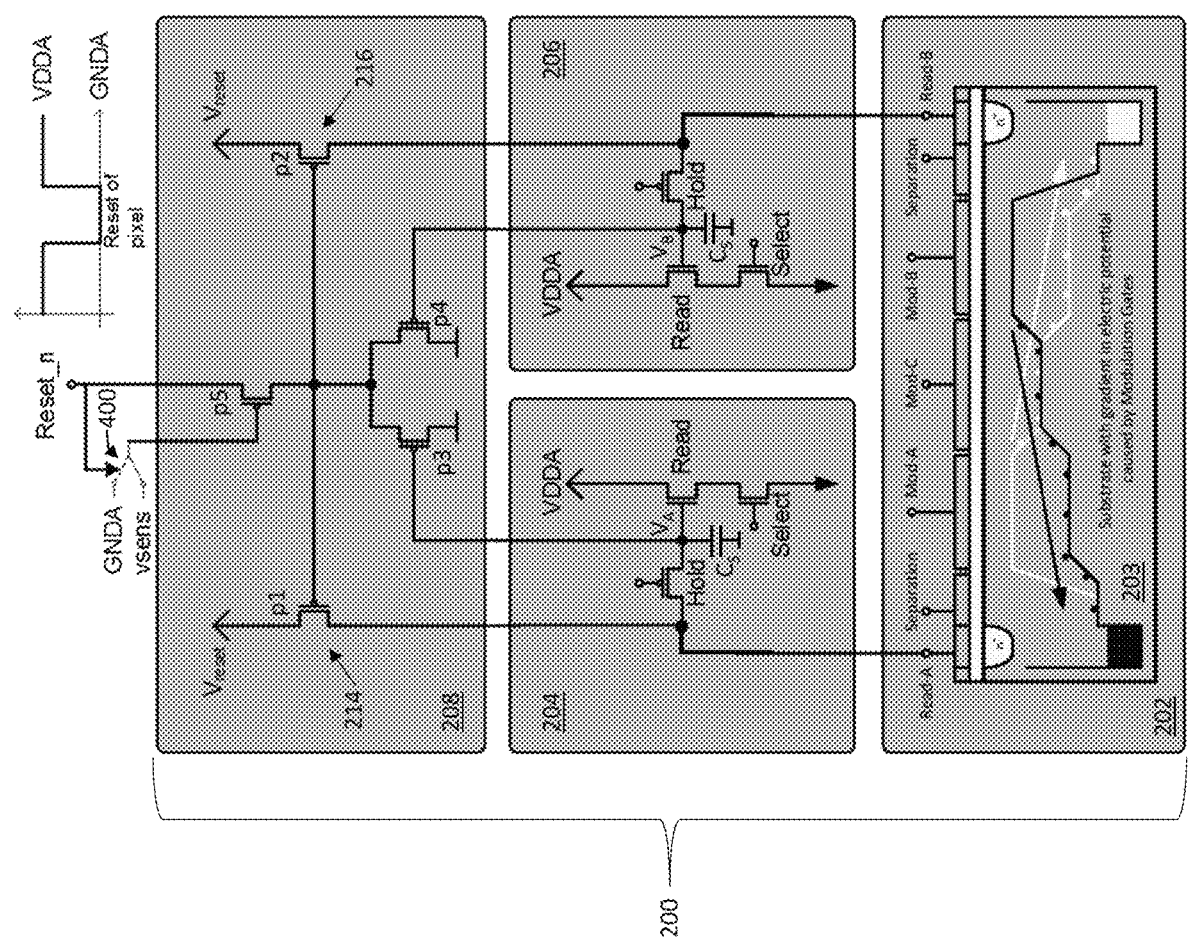
FIG. 9 illustrates a schematic diagram of another embodiment of each pixel included in the pixel array of the TOF sensor.

FIG. 9 illustrates still another embodiment of each pixel 200 included in the pixel array 102 of the TOF sensor 100. According to this embodiment, each pixel 200 of the pixel array 102 contains 11 transistors. The embodiment shown in FIG. 9 is similar to the embodiment shown in FIGS. 3, 6 and 8. Different, however, recharging of the storage devices $C_S$ of each readout circuit 204, 206 of each pixel 200 is controlled by one or more global reset transistors 400 located outside the pixel array 102. For example, depending on the organization of the pixel array 102, a global reset transistor 400 may be provided for different subsets of the array 102, e.g., one global reset transistor 400 per row, per column, etc. Instead, a single global reset transistor 400 may be used for the entire pixel array 102.

In each case, neither the readout circuits 204, 206 nor the compensation circuit 208 of each pixel 200 includes a reset transistor for controlling the recharging of the storage devices $C_S$ of the readout circuits 204, 206 of each pixel 200. Instead, one or more global reset transistors 400 are provided outside the pixel array 102 for controlled recharging of the pixel storage devices $C_S$.

FIG. 9 shows a global reset transistor 400 configured to turn on the compensation current sources 214, 216 of the compensation circuit 28 of some or all of the pixels 200 included in the pixel array 102, during the reset phase as shown in the upper part of FIG. 5. According to this embodiment, the compensation circuit 208 of each pixel 200 comprises a first pMOS transistor p1 coupled to the first readout circuit 204 of the pixel 200, a second pMOS transistor p2 coupled to the second readout circuit 206 of the pixel 200, a pull-down circuit formed by pMOS transistors p3, p4 configured to pull down the gate of pMOS transistors p1, p2 to ground responsive to the voltage at the first node 'Read-A' or the second node 'Read-B' of the differential pixel 202 reaching a threshold, and a pull-up circuit formed by pMOS transistor p5 having a first node coupled to the gate of pMOS transistors p3, p4 of the pull-down circuit and a second node Reset_n coupled to either a voltage supply (vsens) or ground (GNDA) through the global reset transistor 400.

In one embodiment, the first node of the pull-up pMOS transistor p5 is at VDDA and the gate of the pull-up pMOS transistor p5 is at a bias voltage vsens (e.g. constant bias) during the exposure phase, which is shown in the middle part of FIG. 5. Both the first node and the gate of the pull-up pMOS transistor p5 are at ground during the reset phase, which is shown in the upper part of FIG. 5. The global reset transistor 400 is connected between ground and the gate of the pMOS transistor compensation current sources p1, p2 of each compensation circuit 208. While each readout circuit 204, 206 of each pixel 200 is shown as a 3-transistor readout circuit in FIG. 9, each readout circuit 204, 206 of each pixel 200 may instead consist of two transistors and a transfer gate, e.g., as shown in FIG. 8.

Terms such as "first", "second", and the like, are used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

It is to be understood that the features of the various embodiments described herein may be combined with each other, unless specifically noted otherwise.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A time-of-flight (TOF) sensor, comprising:
an array of pixels,
wherein each pixel of the array of pixels comprises:
a differential pixel configured to output a differential voltage signal between a first node and a second node, based on an electrical modulation signal applied to different regions of the differential pixel and an incoming correlated light signal;
a first readout circuit coupled to the first node;
a second readout circuit coupled to the second node; and
a compensation circuit coupled to the first and the second readout circuits and configured to compensate for offset caused by incoming uncorrelated light,
wherein each readout circuit of each pixel has a storage device configured to be discharged by photo current during an exposure phase, sensed during a readout phase and recharged during a reset phase,
wherein recharging of the storage device of each readout circuit of each pixel is controlled by a single reset transistor included in each compensation circuit or by one or more global reset transistors located outside the array of pixels.

2. The TOF sensor of claim 1, wherein the compensation circuit of each pixel comprises a first compensation current source coupled to the first readout circuit of the pixel and a second compensation current source coupled to the second readout circuit of the pixel, and wherein recharging of the storage device of each readout circuit of each pixel is controlled by a single reset transistor included in each compensation circuit and configured to turn on the first and the second compensation current sources during the reset phase.

3. The TOF sensor of claim 1, wherein the compensation circuit of each pixel comprises a first pMOS transistor coupled to the first readout circuit of the pixel and a second pMOS transistor coupled to the second readout circuit of the pixel, and wherein recharging of the storage device of each readout circuit of each pixel is controlled by a single reset transistor included in each compensation circuit and connected between a gate of the first and the second pMOS transistors of the compensation circuit and ground and having a gate coupled to a control signal that is active during the reset phase.

4. The TOF sensor of claim 1, wherein the compensation circuit of each pixel comprises a first compensation current source coupled to the first readout circuit of the pixel and a second compensation current source coupled to the second readout circuit of the pixel, and wherein recharging of the storage device of each readout circuit of each pixel is controlled by one or more global reset transistors located outside the array of pixels and configured to turn on the first and the second compensation current sources of each compensation circuit during the reset phase.

5. The TOF sensor of claim 1, wherein the compensation circuit of each pixel comprises a first pMOS transistor coupled to the first readout circuit of the pixel, a second pMOS transistor coupled to the second readout circuit of the pixel, a pull-down circuit configured to pull down a gate of the first and the second pMOS transistors to ground responsive to the voltage at the first node or the second node of the differential pixel reaching a threshold, and a pull-up circuit having a first node coupled to the gate of the first and the second pMOS transistors and a second node coupled to either a voltage supply or ground through the one or more global reset transistors, and wherein the one or more global reset transistors is configured to couple a gate of each pull-up circuit to a bias voltage and the second node of each pull-up circuit to the voltage supply during the exposure phase, and to couple the gate of each pull-up circuit to ground and the second node of each pull-up circuit to ground during the reset phase.

6. The TOF sensor of claim 1, wherein each readout circuit of each pixel is a 3-transistor readout circuit.

7. The TOF sensor of claim 1, wherein each readout circuit of each pixel consists of two transistors and a transfer gate.

8. A time-of-flight (TOF) sensor, comprising:
an array of pixels,
wherein each pixel of the array of pixels comprises:
a differential pixel configured to output a differential voltage signal between a first node and a second node, based on an electrical modulation signal applied to different regions of the differential pixel and an incoming correlated light signal;

a first readout circuit coupled to the first node;
a second readout circuit coupled to the second node; and
a compensation circuit coupled to the first and the second readout circuits and configured to compensate for offset caused by incoming uncorrelated light,
wherein each readout circuit of each pixel has a storage device configured to be discharged by photo current during an exposure phase, sensed during a readout phase and recharged during a reset phase,
wherein recharging of the storage device of each readout circuit of each pixel is controlled by a single reset transistor included in each compensation circuit.

9. The TOF sensor of claim 8, wherein the compensation circuit of each pixel comprises a first compensation current source coupled to the first readout circuit of the pixel and a second compensation current source coupled to the second readout circuit of the pixel, and wherein the single reset transistor included in the compensation circuit of each pixel is configured to turn on the first and the second compensation current sources of the compensation circuit during the reset phase.

10. The TOF sensor of claim 9, wherein the first compensation current source of each pixel comprises a first pMOS transistor coupled to the first readout circuit of the pixel, wherein the second compensation current source of each pixel comprises a second pMOS transistor coupled to the second readout circuit of the pixel, and wherein the single reset transistor included in the compensation circuit of each pixel is connected between ground and a gate of the first and the second pMOS transistors of the compensation circuit and has a gate coupled to a control signal that is active during the reset phase.

11. The TOF sensor of claim 8, wherein the first readout circuit of each differential pixel comprises a first hold transistor, a first read transistor, a first select transistor and no reset transistor, wherein the second readout circuit of each differential pixel comprises a second hold transistor, a second read transistor, a second select transistor and no reset transistor, wherein the compensation circuit of each pixel comprises a first pMOS transistor coupled to the first readout circuit of the pixel, a second pMOS transistor coupled to the second readout circuit of the pixel, a single pull-up pMOS transistor coupled to a gate of the first and the second pMOS transistors, a pair of pull-down pMOS transistors coupled to the gate of the first and the second pMOS transistors and the single reset transistor which is connected between ground and the gate of the first and the second pMOS transistors.

12. The TOF sensor of claim 8, wherein each readout circuit of each pixel is a 3-transistor readout circuit.

13. The TOF sensor of claim 8, wherein each readout circuit of each pixel consists of two transistors and a transfer gate.

14. A time-of-flight (TOF) sensor, comprising:
an array of pixels,
wherein each pixel of the array of pixels comprises:
a differential pixel configured to output a differential voltage signal between a first node and a second node, based on an electrical modulation signal applied to different regions of the differential pixel and an incoming correlated light signal;
a first readout circuit coupled to the first node;
a second readout circuit coupled to the second node; and
a compensation circuit coupled to the first and the second readout circuits and configured to compensate for offset caused by incoming uncorrelated light,
wherein each readout circuit of each pixel has a storage device configured to be discharged by photo current during an exposure phase, sensed during a readout phase and recharged during a reset phase,
wherein recharging of the storage device of each readout circuit of each pixel is controlled by one or more global reset transistors located outside the array of pixels.

15. The TOF sensor of claim 14, wherein the compensation circuit of each pixel comprises a first compensation current source coupled to the first readout circuit of the pixel and a second compensation current source coupled to the second readout circuit of the pixel, and wherein the one or more global reset transistors is configured to turn on the first and the second compensation current sources of each compensation circuit during the reset phase.

16. The TOF sensor of claim 14, wherein the compensation circuit of each pixel comprises a first pMOS transistor coupled to the first readout circuit of the pixel, a second pMOS transistor coupled to the second readout circuit of the pixel, a pull-down circuit configured to pull down a gate of the first and the second pMOS transistors to ground responsive to the voltage at the first node or the second node of the differential pixel reaching a threshold, and a pull-up circuit having a first node coupled to the gate of the first and the second pMOS transistors and a second node coupled to either a voltage supply or ground through the one or more global reset transistors, and wherein the one or more global reset transistors is configured to couple a gate of each pull-up circuit to a bias voltage and the second node of each pull-up circuit to the voltage supply during the exposure phase, and couple the gate of each pull-up circuit to ground and the second node of each pull-up circuit to ground during the reset phase.

17. The TOF sensor of claim 14, wherein the first readout circuit of each differential pixel comprises a first hold transistor, a first read transistor, a first select transistor and no reset transistor, wherein the second readout circuit of each differential pixel comprises a second hold transistor, a second read transistor, a second select transistor and no reset transistor, and wherein the compensation circuit of each pixel comprises a first pMOS transistor coupled to the first readout circuit of the pixel, a second pMOS transistor coupled to the second readout circuit of the pixel, a single pull-up pMOS transistor coupled to a gate of the first and the second pMOS transistors, a pair of pull-down pMOS transistors coupled to the gate of the first and the second pMOS transistors, and wherein the one or more global reset transistors is connected between ground and the gate of the first and the second pMOS transistors of each compensation circuit.

18. The TOF sensor of claim 14, wherein each readout circuit of each pixel is a 3-transistor readout circuit.

19. The TOF sensor of claim 14, wherein each readout circuit of each pixel consists of two transistors and a transfer gate.

* * * * *